United States Patent
Cheng et al.

(10) Patent No.: US 10,312,132 B2
(45) Date of Patent: Jun. 4, 2019

(54) FORMING SACRIFICIAL ENDPOINT LAYER FOR DEEP STI RECESS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Sebastian Naczas, Albany, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 15/414,752

(22) Filed: Jan. 25, 2017

(65) Prior Publication Data
US 2018/0211866 A1    Jul. 26, 2018

(51) Int. Cl.
| | |
|---|---|
| *H01L 29/76* | (2006.01) |
| *H01L 21/02* | (2006.01) |
| *H01L 21/762* | (2006.01) |
| *H01L 29/66* | (2006.01) |
| *H01L 21/8234* | (2006.01) |
| *H01L 21/8238* | (2006.01) |
| *H01L 21/84* | (2006.01) |
| *H01L 29/78* | (2006.01) |

(52) U.S. Cl.
CPC ........... *H01L 21/76224* (2013.01); *H01L 21/823431* (2013.01); *H01L 21/823481* (2013.01); *H01L 21/823821* (2013.01); *H01L 21/823878* (2013.01); *H01L 21/845* (2013.01); *H01L 29/66795* (2013.01); *H01L 29/66666* (2013.01); *H01L 29/7827* (2013.01)

(58) Field of Classification Search
CPC .................................. H01L 21/02; H01L 29/76
See application file for complete search history.

(56) References Cited

U.S. PATENT DOCUMENTS

| | | |
|---|---|---|
| 6,339,241 B1 | 1/2002 | Mandelman et al. |
| 6,355,518 B1 | 3/2002 | Wu et al. |
| 8,354,320 B1 | 1/2013 | Xie et al. |
| 9,209,176 B2 | 12/2015 | Wu et al. |
| 9,412,641 B1 | 8/2016 | Guo et al. |

(Continued)

OTHER PUBLICATIONS

Du et al., "Optimization of STI Oxide Recess Uniformity for Finfet Beyod 20NM", Semiconductor Technology International Conference. Mar. 15-16, 2015. Shanghai, China. pp. 1-4.

(Continued)

*Primary Examiner* — Joseph C. Nicely
*Assistant Examiner* — Lamont B Koo
(74) *Attorney, Agent, or Firm* — Tutunjian & Bitetto, P.C.; Vazken Alexanian (57) ABSTRACT

A method is presented for forming a semiconductor structure. The method includes forming a plurality of fins over a substrate, forming one or more shallow isolation trench (STI) structures defining a first region and a second region, forming a liner dielectric and forming spacers adjacent sidewalls of the plurality of fins and adjacent the one or more STI structures. The method further includes filling the one or more STI structures with an oxide layer, and incrementally recessing the oxide layer and the spacers adjacent the plurality of fins in an alternate manner until a proximal end of the second region is detected.

20 Claims, 6 Drawing Sheets

(56) References Cited

U.S. PATENT DOCUMENTS

| | | | |
|---|---|---|---|
| 2005/0136582 A1* | 6/2005 | Aller | G06F 17/5068 |
| | | | 438/197 |
| 2006/0118876 A1* | 6/2006 | Lee | H01L 29/66795 |
| | | | 257/365 |
| 2007/0090443 A1* | 4/2007 | Choi | H01L 21/84 |
| | | | 257/314 |
| 2008/0099834 A1* | 5/2008 | Willer | H01L 21/823431 |
| | | | 257/330 |
| 2009/0173980 A1 | 7/2009 | Cheng et al. | |
| 2010/0163971 A1* | 7/2010 | Hung | H01L 29/66795 |
| | | | 257/327 |
| 2011/0045648 A1 | 2/2011 | Knorr et al. | |
| 2011/0260282 A1 | 10/2011 | Kawasaki | |
| 2012/0032267 A1 | 2/2012 | Cheng et al. | |
| 2013/0221491 A1 | 8/2013 | Wann et al. | |
| 2014/0203376 A1 | 7/2014 | Xie et al. | |
| 2016/0379982 A1* | 12/2016 | You | H01L 29/0657 |
| | | | 257/369 |

OTHER PUBLICATIONS

Li et al., "Fluorocarbon-based plasma etching of SiO2: Comparison of C4F6/Ar and C4F8/Ar discharges", Journal of Vacuum Science & Technology A Vaccuum Surfaces and Films. vol. 20: No. 6. Nov. 1, 2002. pp. 2052-2061.

Redolfi et al., "Bulk FinFET Fabrication with New Approaches for Oxide Topography Control Using Dry Removal Techniques", 12th International Conference on Ultimate Integration on Silicon (ULIS). Mar. 14-16, 2011. pp. 1-4.

* cited by examiner

FORMING SACRIFICIAL ENDPOINT LAYER FOR DEEP STI RECESS

BACKGROUND

Technical Field

The present invention relates generally to semiconductor devices, and more specifically, to forming a sacrificial endpoint layer for deep shallow trench isolation (STI) recess.

Description of the Related Art

A typical semiconductor device in a complementary metal-oxide-semiconductor (CMOS) circuit is formed in a p-well or an n-well in a semiconductor substrate. Since other semiconductor devices are also present in the semiconductor substrate, a given semiconductor device requires electrical isolation from adjacent semiconductor devices. Electrical isolation is provided by isolation structures that employ trenches filled with an insulator material (e.g., shallow trench isolation or "STI" regions). The electrical isolation of a semiconductor device from other devices located in the same well is referred to as "intra-well" isolation. In contrast, the electrical isolation of a semiconductor device from other devices in an adjacent well (typically of the opposite polarity type, but could also be a same polarity type well of a different well bias) is referred to as "inter-well" isolation. In either case, the unintended functionality of parasitic devices needs to be suppressed. This is typically done by placing a dielectric material, such as an STI structure, in the current paths of the elements of the parasitic devices.

SUMMARY

In accordance with an embodiment, a method is provided for forming a semiconductor structure. The method includes forming a plurality of fins over a substrate, forming one or more shallow isolation trench (STI) structures defining a first region and a second region, forming a liner dielectric, and forming spacers adjacent sidewalls of the plurality of fins and adjacent the one or more STI structures. The method further includes filling the one or more STI structures with an oxide layer, and incrementally recessing the oxide layer and the spacers adjacent the plurality of fins in an alternate manner until a proximal end of the second region is detected.

In accordance with an embodiment, a method is provided for forming a semiconductor structure. The method includes forming a plurality of fins over a substrate, forming at least one shallow isolation trench (STI) structure, and forming polysilicon spacers adjacent sidewalls of the plurality of fins and adjacent the at least one STI structure. The method further includes filling the at least one STI structure with an STI oxide and alternately recessing the STI oxide and the polysilicon spacers adjacent the plurality of fins in a stepwise manner until the polysilicon spacers adjacent the plurality of fins are entirely removed.

In accordance with another embodiment, a semiconductor device is provided. The semiconductor device includes a plurality of fins formed over a substrate, one or more shallow isolation trench (STI) structures defining a first region and a second region, a liner dielectric, spacers adjacent sidewalls of the plurality of fins and adjacent the one or more STI structures, and an oxide layer for filling the one or more STI structures. The oxide layer and the spacers adjacent the plurality of fins are incrementally recessed in an alternate manner until a proximal end of the second region is detected.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

DETAILED DESCRIPTION

In one or more embodiments, a method includes forming a plurality of fins over a substrate, forming one or more shallow isolation trench (STI) structures defining a first region and a second region, forming a liner dielectric, and forming spacers adjacent sidewalls of the plurality of fins and adjacent the one or more STI structures. The method further includes filling the one or more STI structures with an oxide layer, and incrementally recessing the oxide layer and the spacers adjacent the plurality of fins in an alternate manner until a proximal end of the second region is detected.

In one or more embodiments, a method includes forming a plurality of fins over a substrate, forming at least one shallow isolation trench (STI) structure, and forming polysilicon spacers adjacent sidewalls of the plurality of fins and adjacent the at least one STI structure. The method further includes filling the at least one STI structure with an STI oxide, and alternately recessing the STI oxide and the polysilicon spacers adjacent the plurality of fins in a stepwise manner until the polysilicon spacers adjacent the plurality of fins are entirely removed.

In one or more embodiments, a semiconductor structure includes a plurality of fins formed over a substrate, one or more shallow isolation trench (STI) structures defining a first region and a second region, a liner dielectric, spacers adjacent sidewalls of the plurality of fins and adjacent the one or more STI structures, and an oxide layer for filling the one or more STI structures. The oxide layer and the spacers adjacent the plurality of fins are incrementally recessed in an alternate manner until a proximal end of the second region is detected.

In one or more embodiments, when the STI is recessed to only a deep STI region, polysilicon (sidewall spacers) only exist on sidewalls of the deep trench. Thus, the Si signal changes to a very low level and this signal change can be captured to indicate an end-point of the STI recess process.

In one or more embodiments, the present invention is directed to various methods of forming fins and isolation regions on a FinFET semiconductor device. As will be readily apparent to those skilled in the art upon a complete reading of the present application, the methods described herein may be employed in manufacturing a variety of different devices, including, but not limited to, logic devices, memory devices, etc., and they may be employed with respect to a variety of different technologies, e.g., N-type FinFET devices, P-type FinFET devices, CMOS applications, etc.

In forming integrated circuits, it is necessary to electrically isolate certain device or circuits from one another. This is typically accomplished by forming one or more isolation structures, comprised of an insulating material. In modern-day devices, the isolation regions are typically so-called shallow trench isolation (STI) structures wherein one or more insulating materials are formed in a trench that has been formed in a semiconductor substrate. In the case of FinFET devices, the formation of isolation regions is a bit more complex as there needs to be a relatively deep device isolation region that separates the device, e.g., an N-type FinFET device, from other devices, such as a P-type FinFET device. Additionally, in the case of a multiple fin FinFET device, a shallow isolation region is formed between the adjacent fins of the device. The exemplary embodiments of the present invention describe a method for forming isolation regions by forming sacrificial endpoint spacers to recess the STI to have better process control.

Disclosed herein, in part, are methods of fabricating a semiconductor device having an isolation feature within a fin structure which, for instance, facilitates isolating circuit elements associated with the fin structure. As discussed above, in fabricating integrated circuits (ICs), the desire for reduced component size features and circuit dimensions has led to significant challenges using existing fabricating techniques, including isolation of circuit features being formed on a wafer.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
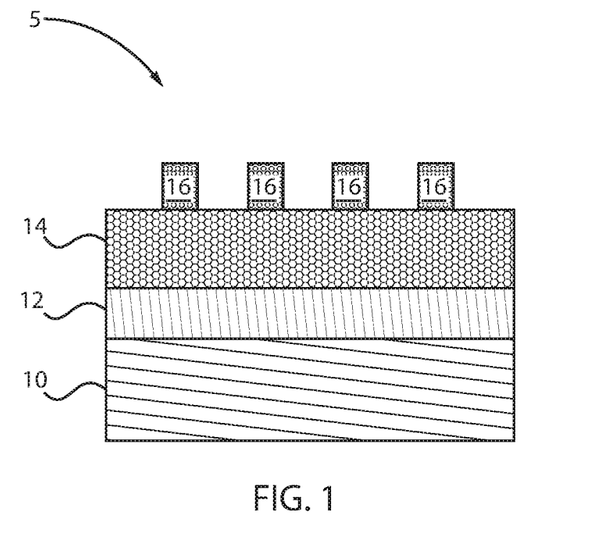
FIG. 1 is a cross-sectional view of a semiconductor structure including a silicon nitride (SiN) fin hard mask formed over silicon (Si), in accordance with an embodiment of the present invention.

FIG. 1 is a cross-sectional view of a semiconductor structure including a silicon nitride (SiN) fin hard mask formed over silicon (Si), in accordance with an embodiment of the present invention.

A semiconductor structure 5 includes a semiconductor substrate 10 with a doped bottom source/drain (S/D) layer 12 deposited over the substrate 10. An undoped channel region 14 is deposited over the bottom S/D layer 12. The undoped channel region 14 is used to form a plurality of fins, as described below. The undoped channel region 14 can be, e.g., silicon (Si). The bottom source/drain (S/D) layer 12 can be, e.g., an n-type doped material. A hard mask 16 is deposited over the undoped channel region 14. The hard mask 16 can be, e.g., a silicon nitride (SiN) hard mask. The hard mask 16 can be e.g., a fin hard mask for forming fin structures.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Figure 2:
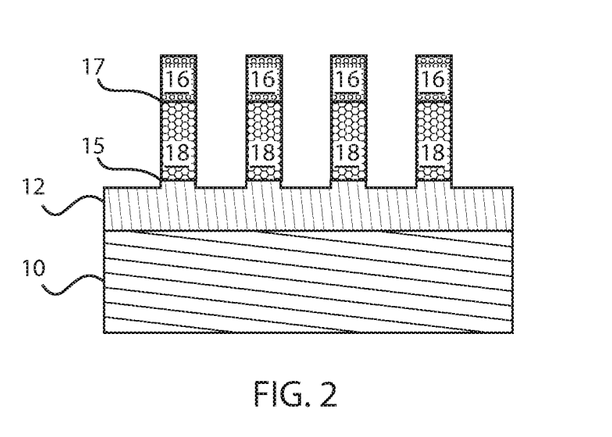
FIG. 2 is a cross-sectional view of the semiconductor structure of FIG. 1 where a plurality of vertical fins are formed by etching the silicon (Si), in accordance with an embodiment of the present invention.

FIG. 2 is a cross-sectional view of the semiconductor structure of FIG. 1 where a plurality of vertical fins are formed by etching the silicon (Si), in accordance with an embodiment of the present invention.

In various embodiments, the undoped channel region 14 is etched to form fins 18. The hard mask 16 remains over the fins 18 after etching the undoped channel region 14. The hard mask 16 can be, e.g., a silicon nitride (SiN) hard mask 16. A distal portion of the fins 18 extends up to the doped S/D layer 12. The fins 18 extend vertically from the substrate 10. Stated differently, the fins 18 are normal to or perpendicular to the substrate 10. The fins 18 can define a distal end 15 and a proximal end 17.

As used herein, a "semiconductor fin" refers to a semiconductor structure including a portion having a shape of a rectangular parallelepiped. The direction along which a semiconductor fin 18 laterally extends the most is herein referred to as a "lengthwise direction" of the semiconductor fin 18. The height of each semiconductor fin 18 can be in a range from 5 nm to 300 nm, although lesser and greater heights can also be employed. The width of each semiconductor fin 18 can be in a range from 5 nm to 100 nm, although lesser and greater widths can also be employed. In various embodiments, the fins 18 can have a width in the range of about 6 nm to about 20 nm, or can have a width in the range of about 8 nm to about 15 nm, or in the range of about 10 nm to about 12 nm. In various embodiments, the fin 18 can have a height in the range of about 25 nm to about 75 nm, or in the range of about 40 nm to about 50 nm.

Multiple semiconductor fins 18 can be arranged such that the multiple semiconductor fins 18 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 18 includes a pair of parallel sidewalls along the lengthwise direction.

In one embodiment, each semiconductor fin 18 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 18 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 18 has been formed. In another embodiment, sequential SIT processes can be utilized to form fins with highly scaled fin width and pitches.

In some embodiments, the fins 18 in the plurality of semiconductor fins can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

Figure 3:
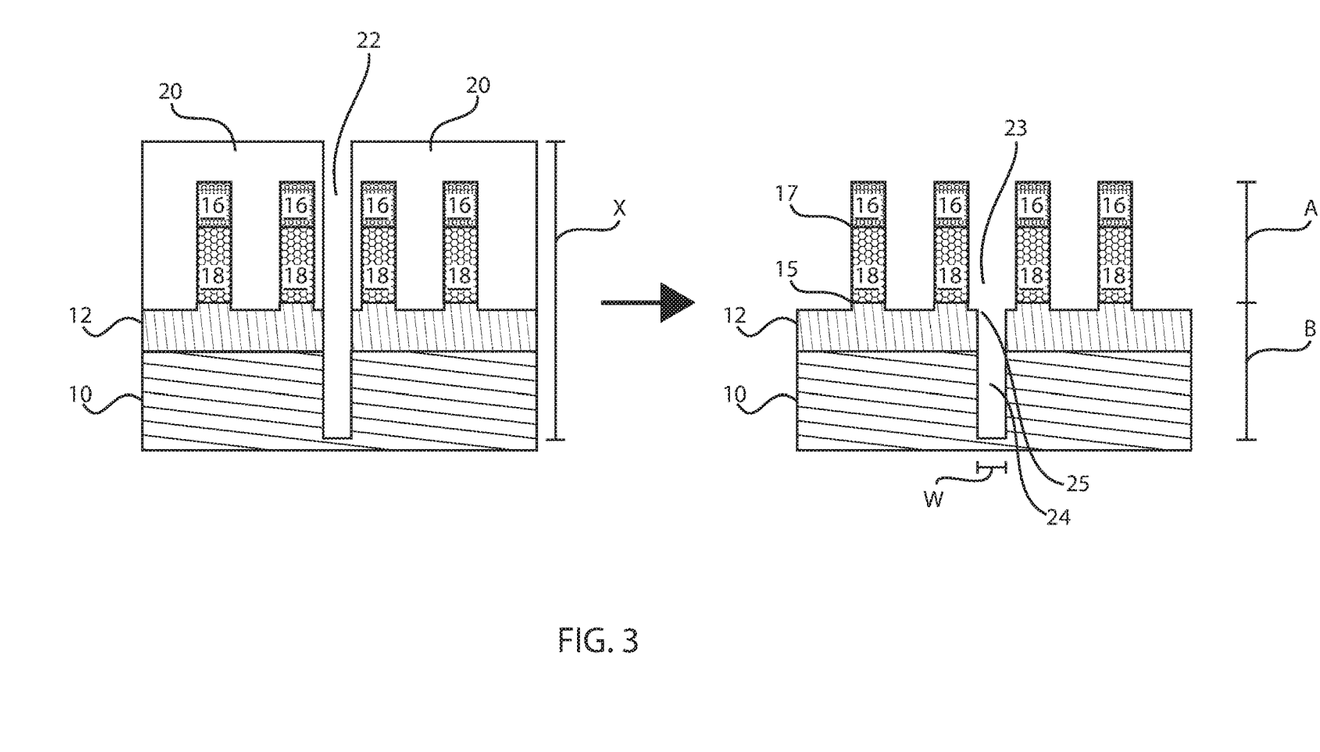
FIG. 3 is a cross-sectional view of the semiconductor structure of FIG. 2 where a deep shallow trench isolation (STI) mask is applied over portions of the plurality of fins and a deep STI recess is formed, in accordance with an embodiment of the present invention.

FIG. 3 is a cross-sectional view of the semiconductor structure of FIG. 2 where a deep shallow trench isolation (STI) mask is applied over portions of the plurality of fins and a deep STI recess is formed, in accordance with an embodiment of the present invention.

In various embodiments, a mask 20 is applied over the plurality of fins 18. After the mask 20 is applied, a recess or trench 22 is formed between the plurality of fins 18. The recess 22 extends a length "X" from a top surface of the mask 20 into the substrate 10. After formation of the recess 22, etching of the mask 20 takes place. The etching can be, e.g., an RIE etch. The etching removes the entire mask 20. Removal of the mask 20 results in the formation of an STI structure having a first region 23 and a second region 24. The first region extends a distance "A" and the second region extends a distance "B." The width of the second region 24 is designated as "W." The width of the second region 24 is less than the width of the first region 23. The first region 23 is defined as a region formed between the plurality of fins 18, the fins 18 having a proximal end 17 and a distal end 15. The second region 24 is defined as a region formed within the substrate 10, as well as within the bottom source/drain (S/D) layer 12 deposited over the substrate 10. The second region 24 can also be referred to as a deep STI region. The second region 24 is offset from the plurality of fins 18. The proximal endpoint 25 of the second region 24 is located near or at the distal end 15 of the fins 18.

The block masks can comprise soft and/or hard mask materials and can be formed using deposition, photolithography and etching. In one embodiment, the block mask comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

The block mask can comprise soft and/or hard mask materials and can be formed using deposition, photolithography and etching. In one embodiment, the block mask is a hard mask composed of a nitride-containing material, such as silicon nitride. It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting the plurality of fins. A patterned photoresist can be produced by applying a blanket photoresist layer to the surface of the plurality of fins, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 4:
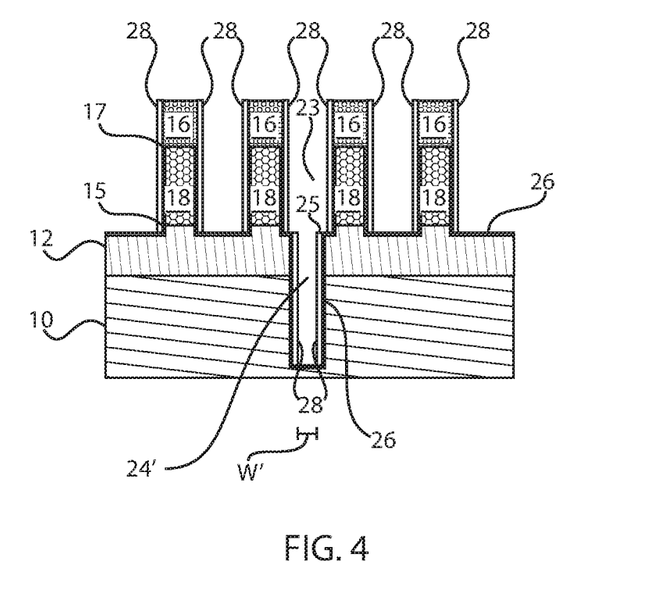
FIG. 4 is a cross-sectional view of the semiconductor structure of FIG. 3 where a dielectric liner is applied and spacers are formed on sidewalls of the plurality of fins, in accordance with an embodiment of the present invention.

FIG. 4 is a cross-sectional view of the semiconductor structure of FIG. 3 where a dielectric liner is applied and spacers are formed on sidewalls of the plurality of fins, in accordance with an embodiment of the present invention.

In various embodiments, a dielectric liner 26 is deposited over the structure. The dielectric liner 36 can be, e.g., a silicon nitride (SiN) liner. The SiN liner 26 covers sidewalls of the exposed fins 18, as well as sidewalls/top surface of the hard mask 16. The SiN liner 26 is also formed within the deep trench 24'. The SiN liner 26 is a conformal liner that prevents the Si channel and the bottom source/drain (S/D) layer 12 from oxidation during STI annealing.

In various embodiments, spacers 28 are formed by, e.g., an RIE etch. The spacers 28 can be, e.g., a nitride film (i.e., nitride layer 26). In an embodiment, the spacers 28 can be an oxide, for example, silicon oxide (SiO), a nitride, for example, a silicon nitride (SiN), or an oxynitride, for example, silicon oxynitride (SiON). In an embodiment, the spacers 28 can be, e.g., SiOCN, SiBCN, or similar film types. The spacers 28 can also be referred to as a non-conducting dielectric layer.

In some exemplary embodiments, the spacers 28 can include a material that is resistant to some etching processes such as, for example, HF chemical etching or chemical oxide removal etching.

In one or more embodiments, the spacers 28 can have a thickness in the range of about 3 nm to about 10 nm, or in the range of about 3 nm to about 5 nm.

The spacers 28 extend to a top portion of the hard mask 16 formed over the fins 18. In other words, the top surface of the spacers 28 are flush with the hard mask 16. The spacers 28 can have a thickness that is less than a thickness of the fins 18 and less than a thickness of the hard mask 16. The spacers 28 can have a thickness that is greater than the thickness of the SiN liner 26. The spacers 28 can be polysilicon (or poly-Si) spacers.

There are two types of spacers 28 that are being formed. Spacers 28 are formed adjacent the fins 18 and spacers 28 are also formed within the trench 24'. The spacers 28 extend along an entire length of the deep trench 24'. The spacers 28 contact the SiN liner 26 along the entire length of the deep trench 24'. After deposition of the SiN liner 26 and the spacers 28, the deep trench 24' now has a with W'.

Figure 5:
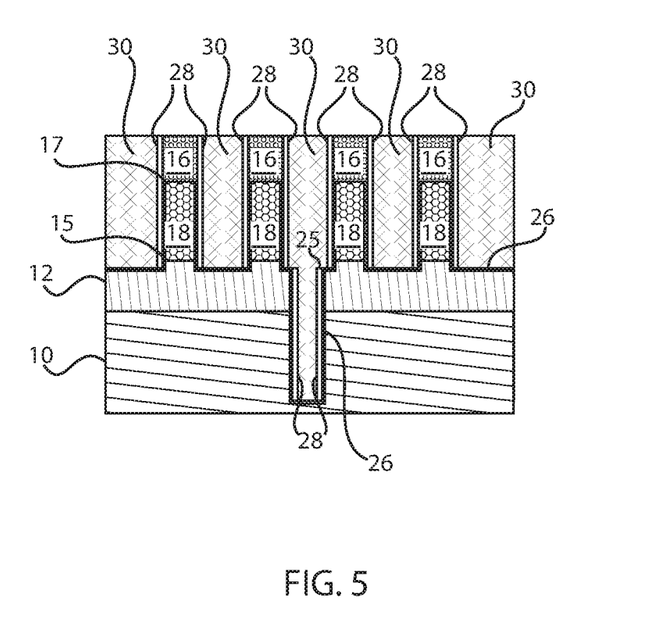
FIG. 5 is a cross-sectional view of the semiconductor device of FIG. 4 where an oxide fill takes place, in accordance with an embodiment of the present invention.

FIG. 5 is a cross-sectional view of the semiconductor device of FIG. 4 where an oxide fill takes place, in accordance with an embodiment of the present invention.

In various embodiments, an oxide gap fill takes place. The ILD oxide 30 is planarized. The ILD oxide 30 fills the remaining gap or recess between the fins 18. The ILD oxide 30 extends to a top surface of the hard mask 16. In other words, the ILD oxide 30 can be flush with the nitride layer 16. The ILD oxide 30 also fills the gap or deep recess of the second region 24'. Thus, the ILD oxide fill 30 contacts the spacers 28 adjacent the fins 18, as well as the spacers 28 within the trench 24'.

In various embodiments, the height of the ILD oxide fill 30 can be reduced by chemical-mechanical polishing (CMP) and/or etching. Therefore, the planarization process can be provided by CMP. Other planarization process can include grinding and polishing.

In one or more embodiments, the ILD oxide 30 can have a thickness in the range of about 3 nm to about 10 nm, or in the range of about 3 nm to about 5 nm.

The ILD 30 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 30 include any of the aforementioned materials in porous form, or in a form that changes during processing to or from being porous and/or permeable to being non-porous and/or non-permeable.

Figure 6:
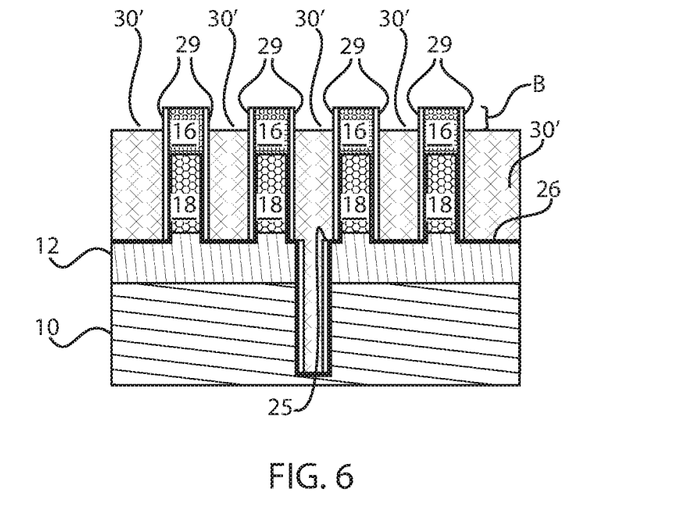
FIG. 6 is a cross-sectional view of the semiconductor device of FIG. 5 where the oxide is selectively etched to expose upper portions of the sidewall spacers of the plurality of fins, in accordance with an embodiment of the present invention.

FIG. 6 is a cross-sectional view of the semiconductor device of FIG. 5 where the oxide is selectively etched to expose upper portions of the sidewall spacers of the plurality of fins, in accordance with an embodiment of the present invention.

In various embodiments, the oxide 30 is selectively etched in an incremental manner (or by an iterative process). This results in the exposure of a top portion 29 of spacers 28 adjacent sidewalls of the hard mask 16. The oxide 30 is etched by an amount or distance "B" that results in remaining oxide 30'. This is the first step in the etching process. The second step is described below with reference to FIG. 7.

Figure 7:
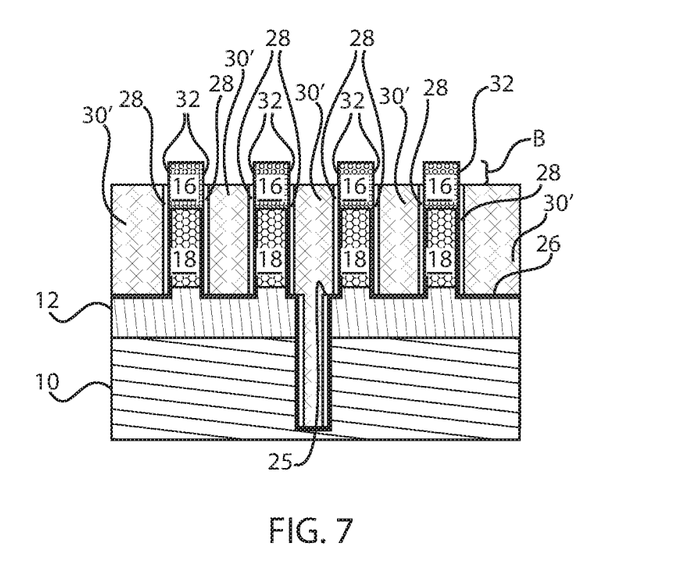
FIG. 7 is a cross-sectional view of the semiconductor device of FIG. 6 where the exposed sidewall spacers are etched away to expose the top side surface of the plurality of fins, in accordance with an embodiment of the present invention.

FIG. 7 is a cross-sectional view of the semiconductor device of FIG. 6 where the exposed sidewall spacers are etched away to expose the top side surface of the plurality of fins, in accordance with an embodiment of the present invention.

In various embodiments, the top portion 29 of spacers 28 adjacent sidewalls of the hard mask 16 are etched, thus exposing the top sidewalls 32 of the hard mask 16. This is the second step of the process. The first and second steps are repeated continuously until an endpoint is reached. The endpoint is reached when all the oxide 30' and the all the spacers 28 adjacent the hard mask 16 and the fins 18 are completely removed. Thus, when the STI is recessed to only a deep STI region, polysilicon (sidewall spacers) only exist on sidewalls of the deep trench. As a result, the Si signal changes to a very low level and this signal change can be captured to indicate an end-point of the STI recess process. Stated differently, the Si signal from the polysilicon spacers is detected during silicon dry etch. Therefore, the process involves incrementally recessing the oxide layer 30' and the spacers 28 adjacent the plurality of fins 18 in an alternate manner until a proximal end of the second region 24' is detected. The endpoint of the second region 24' is designated by proximal endpoint 25 located near or at the distal end 15 of the fins 18.

Figure 8:
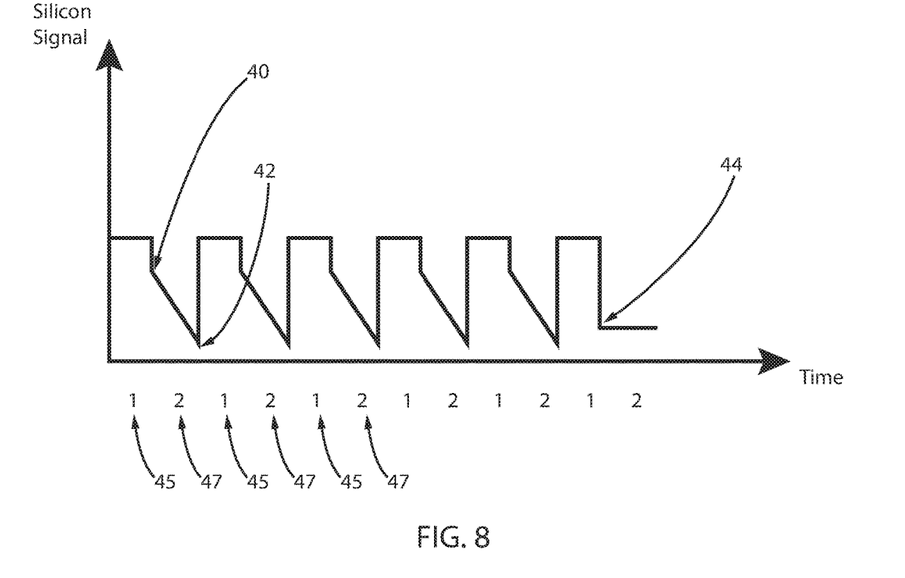
FIG. 8 is a graph illustrating the continuous incremental recessing of the oxide layer and the sidewall spacers adjacent the plurality of fins in an alternate manner until a proximal end of a region of the deep STI is detected, in accordance with an embodiment of the present invention.

FIG. 8 is a graph illustrating the continuous incremental recessing of the oxide layer and the sidewall spacers adjacent the plurality of fins in an alternate manner until a proximal end of a region of the deep STI is detected, in accordance with an embodiment of the present invention.

In various embodiments, the STI recess is accomplished by repeatedly executing two steps until an endpoint is detected. In the first step 45, the oxide 30' is incrementally etched to expose the sidewall spacers 28. In the second step 47, the exposed sidewall spacer 29 is etched away to expose the SiN layer 26. This process continuous several times by incrementally and methodically etching or reducing or removing the oxide and the spacers in an alternate manner (or in an iterative manner) until an endpoint is detected that signals the completion of such two-step process. Stated differently, the exemplary embodiments of the present invention alternately recess the STI oxide 30' and the polysilicon spacers 28 adjacent the plurality of fins 18 in a stepwise or iterative manner until the polysilicon spacers 18 adjacent the plurality of fins 18 are entirely removed.

For example, point 40 indicates a decline in the Si signal during the second step 47. This is shown as a declining slope. Point 42 indicates the completion of the removal of the exposed polysilicon spacer 29 for that iteration. When that iteration ends, the process switches back to the first step 45 to reduce the oxide level by another incremental amount. Once that's accomplished, the process moves back to the second step 47 to now etch the newly exposed sidewall spacer 29, and so forth until the entire oxide 30' is removed and the entire exposed sidewall spacer 29 adjacent the hard mask 16 and the fins 18 is completely removed.

Point 44 indicates a very low level of the Si signal. This is indicated as a flat line (as opposed to a declining slope). Thus, after the STI is recessed below the fin 18, the value at point 44 is less than or lower than the value at point 40. The STI recess rate decreased due to a small size trench when in the deep STI region. At this point of the process, only a few polysilicon liners are exposed in the STI sidewall compared to a large amount of polysilicon liners on the sidewalls of the fins. This is the indication of the endpoint of the two-step process. In other words, the process is notified to end at this point. The process being the etching of the oxide and the sidewall spacers adjacent the fins 18. Therefore, the process is triggered to end at endpoint 25. This leaves the oxide and sidewall spacers formed within the deep trench (region 2) intact, as shown below with reference to FIG. 9.

Figure 9:
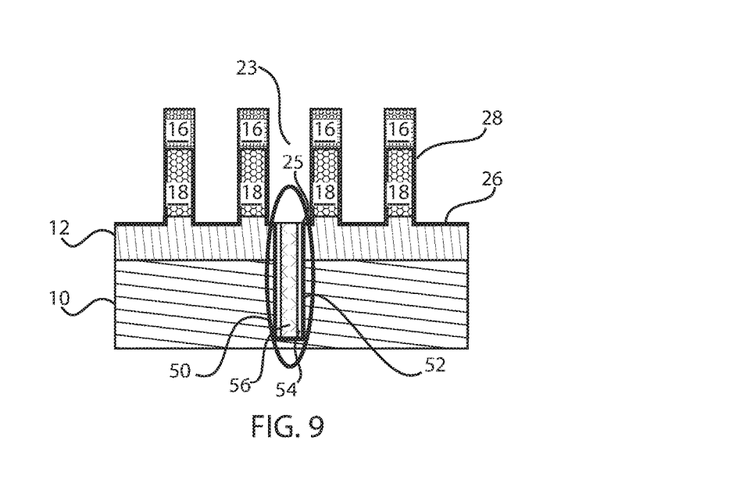
FIG. 9 is a cross-sectional view of the semiconductor device of FIG. 7 where sidewall spacers remain within the deep trench to isolate the plurality of fins, in accordance with an embodiment of the present invention.

FIG. 9 is a cross-sectional view of the semiconductor device of FIG. 7 where sidewall spacers remain within the deep trench to isolate the plurality of fins, in accordance with an embodiment of the present invention.

In various embodiments, an isolation region 50 is formed between the plurality of fins 18. The isolation region 50 includes the deep trench (second region) being filled with a SiN liner 52, polysilicon spacers 54, and oxide 56. The oxide 56 is sandwiched between the spacers 54. The spacers 54 are in contact with or engage the SiN liners 52. The width of the isolation region 50 can be, e.g., less than the width of the fins 18. The isolation region 50 can also be referred to as an isolation pillar. The isolation pillars can be used to isolate sets of fins 18. The isolation region 50 can also be referred to as an isolation trench positioned between first and second sets of fins 18. It is noted that the isolation region 50 or isolation pillar or isolation trench is not in contact with the fins 18. The isolation region 50 can be considered an insulating region.

In some embodiments, the width of the deep isolation region (region 2) may also be greater that the width of the shallow isolation region (region 1). The absolute value of the final depth and final width of the first and second isolation regions can vary depending upon the particular application. For example, the upper surface width can fall within a range of about 20-100 nm, the final depth can fall within a range of about 30-50 nm or the upper surface width can fall within a range of about 100-1000 nm, and the final depth can fall within a range of about 50-100 nm.

Figure 10:
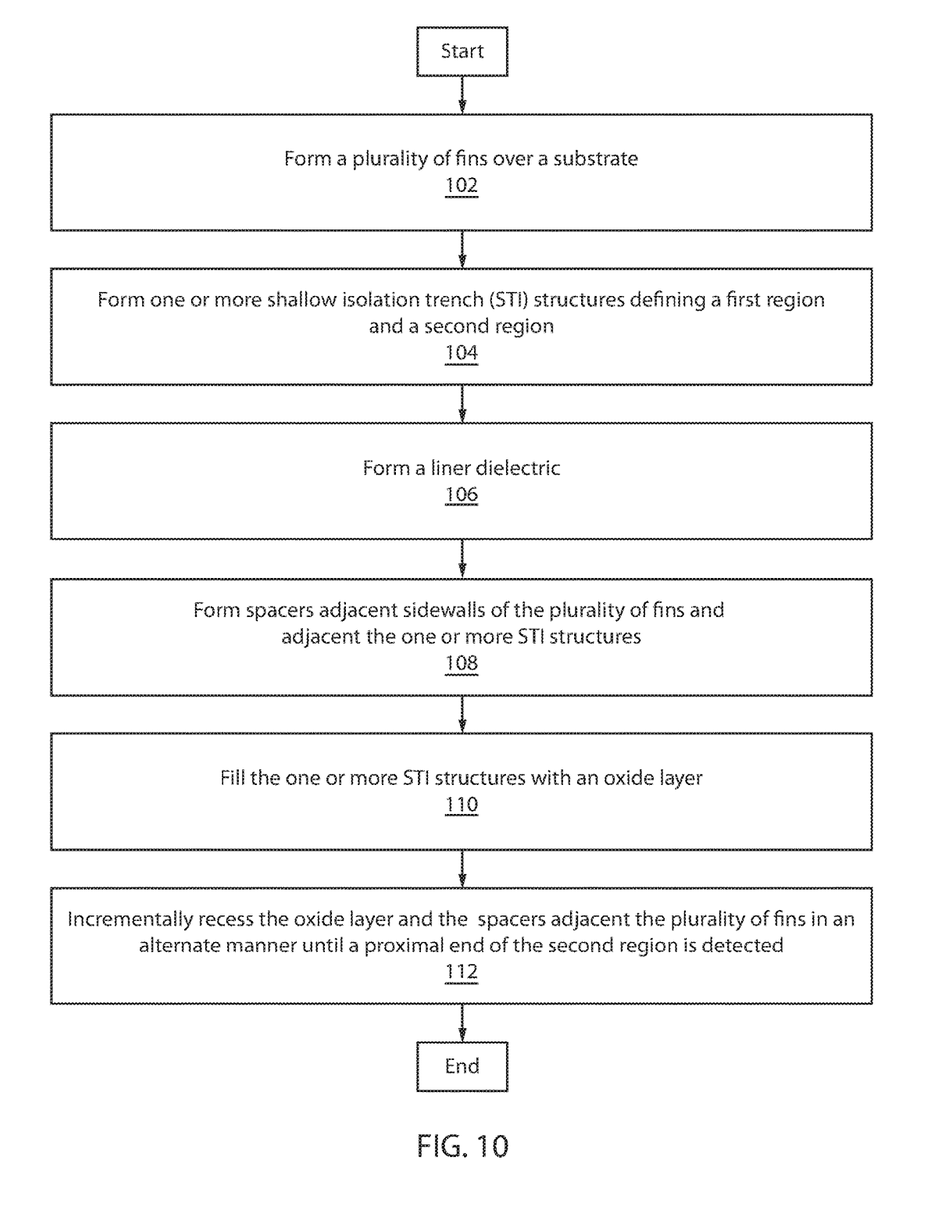
FIG. 10 is a block/flow diagram of an exemplary method for forming a sacrificial endpoint spacer to recess STI, in accordance with an embodiment of the present invention.

FIG. 10 is a block/flow diagram of an exemplary method for forming a sacrificial endpoint spacer to recess STI, in accordance with an embodiment of the present invention.

At block 102, a plurality of fins are formed over a substrate.

At block 104, one or more shallow isolation trench (STI) structures defining a first region and a second region are formed.

At block 106, a liner dielectric is formed.

At block 108, spacers are formed adjacent sidewalls of the plurality of fins and adjacent the one or more STI structures.

At block 110, the one or more STI structures are filled with an oxide layer.

At block 112, the oxide layer and the spacers adjacent the plurality of fins are incrementally recessed in an alternate manner until a proximal end of the second region is detected.

By forming the devices as described herein, a device designer has greater flexibility to tune one or more of the devices so that it is adapted for use with the circuit design under consideration. In short, using the novel methods described herein, the fins can be formed with variations in cross-sectional shape (which is as related to the position of the fin relative to adjacent trenches formed for device isolation regions and the different depth/width of such trenches), all while forming device isolations that have an enhanced capability to electrically isolate adjacent devices. All of this may be accomplished while at the same time the variations in electrical characteristics (i.e., threshold voltage) due to the differences in the cross-sectional configurations of the fins is minimized.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form a replacement metal gate scheme with a self-alignment gate for a VFET (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims.

What is claimed is:

1. A method of forming a semiconductor structure, the method comprising:
   forming a plurality of fins over a substrate;
   forming one or more shallow isolation trench (STI) structures defining a first region and a second region;
   forming a liner dielectric;
   forming spacers adjacent sidewalls of the plurality of fins and adjacent the one or more STI structures;
   filling the one or more STI structures with an oxide layer; and
   incrementally recessing the oxide layer and the spacers adjacent the plurality of fins, multiple times, in an alternating and continuous manner, until the oxide layer is completely removed such that an entirety of each of the plurality of fins remains intact.

2. The method of claim 1, wherein the first region extends a length of the plurality of fins structures.

3. The method of claim 2, wherein the second region extends from a distal end of the plurality of fins into the substrate.

4. The method of claim 3, wherein the first region has a first width and the second region has a second width, the first width being greater than the second width.

5. The method of claim 1, wherein the liner dielectric is a silicon nitride (SiN) liner.

6. The method of claim 1, wherein the spacers are polysilicon spacers.

7. The method of claim 6, wherein the proximal end of the second region is detected when a signal indicates low levels of the polysilicon spacers.

8. The method of claim 6, wherein the polysilicon spacers adjacent the one or more STI structures remain intact after removal of the polysilicon spacers adjacent the plurality of fins.

9. A method of forming a semiconductor structure, the method comprising:
 forming a plurality of fins over a substrate;
 forming at least one shallow isolation trench (STI) structure;
 forming polysilicon spacers adjacent sidewalls of the plurality of fins and adjacent the at least one STI structure;
 filling the at least one STI structure with an STI oxide; and
 alternately recessing, in a continuous manner, the STI oxide and the polysilicon spacers adjacent the plurality of fins, multiple times, in a stepwise manner until the STI oxide is completely removed such that an entirety of each of the plurality of fins remains intact.

10. The method of claim 9, wherein the at least one STI structure defines a first region and a second region.

11. The method of claim 10, wherein the first region extends a length of the plurality of fins structures.

12. The method of claim 11, wherein the second region extends from a distal end of the plurality of fins into the substrate.

13. The method of claim 12, wherein the first region has a first width and the second region has a second width, the first width being greater than the second width.

14. The method of claim 9, further comprising forming a liner dielectric before formation of the polysilicon spacers.

15. The method of claim 14, wherein the liner dielectric is a silicon nitride (SiN) liner.

16. The method of claim 9, wherein the polysilicon spacers adjacent the at least one STI structure remain intact after removal of the polysilicon spacers adjacent the plurality of fins.

17. A semiconductor structure, comprising:
 a plurality of fins formed over a substrate;
 one or more shallow isolation trench (STI) structures defining a first region and a second region;
 a liner dielectric;
 spacers adjacent sidewalls of the plurality of fins and adjacent the one or more STI structures; and
 an oxide layer for filling the one or more STI structures;
 wherein the oxide layer and the spacers adjacent the plurality of fins are incrementally recessed multiple times in an alternating and continuous manner until the oxide layer is completely removed such that an entirety of each of the plurality of fins remains intact.

18. The structure of claim 17, wherein the spacers are polysilicon spacers.

19. The structure of claim 18, wherein the proximal end of the second region is detected when a signal indicates low levels of the polysilicon spacers.

20. The structure of claim 18, wherein the polysilicon spacers adjacent the one or more STI structures remain intact after removal of the polysilicon spacers adjacent the plurality of fins.

* * * * *